United States Patent [19]
Frisina et al.

[11] Patent Number: 5,468,660
[45] Date of Patent: Nov. 21, 1995

[54] PROCESS FOR MANUFACTURING AN INTEGRATED BIPOLAR POWER DEVICE AND A FAST DIODE

[75] Inventors: Ferruccio Frisina; Giuseppe Ferla, both of Catania, Italy

[73] Assignees: Consorzio per la Ricerca Sulla Microelettronica Nel Mezzogiorno; SGS-Thomson Microelectronics S.r.l., both of Italy

[21] Appl. No.: 251,514

[22] Filed: May 31, 1994

Related U.S. Application Data

[62] Division of Ser. No. 852,310, Mar. 18, 1992, Pat. No. 5,343,068.

[30] Foreign Application Priority Data

Mar. 28, 1991 [IT] Italy ................. M191A0836

[51] Int. Cl.⁶ .................................................. H01L 21/77
[52] U.S. Cl. .......................... 437/31; 437/24; 437/142; 437/55
[58] Field of Search ................ 437/24, 55, 142, 437/31, 141, 904

[56] References Cited

U.S. PATENT DOCUMENTS

| | | | |
|---|---|---|---|
| 3,486,950 | 12/1969 | Lesk | 437/142 |
| 3,625,781 | 12/1971 | Joshi et al. | 437/142 |
| 3,640,783 | 2/1972 | Bailey | 437/142 |
| 3,645,808 | 2/1972 | Kamiyama et al. | 148/187 |
| 3,775,196 | 11/1973 | Wakamiya et al. | 437/142 |
| 4,138,690 | 2/1979 | Nawa et al. | 257/610 |
| 5,032,540 | 7/1991 | Follegot | 437/142 |
| 5,128,742 | 7/1992 | Kao et al. | 357/34 |

*Primary Examiner*—Tuan H. Nguyen
*Attorney, Agent, or Firm*—Felsman, Bradley, Gunter & Dillon

[57] ABSTRACT

A bipolar power device and a fast diode are formed in a single chip of semiconductor material. The chip contains a first area having high minority carrier lifetimes in which the bipolar power device is formed. The bipolar power device is therefore capable of handling high current densities. At least one second area of the device is formed with reduced minority carrier lifetimes, with a fast diode being formed in this region.

4 Claims, 4 Drawing Sheets

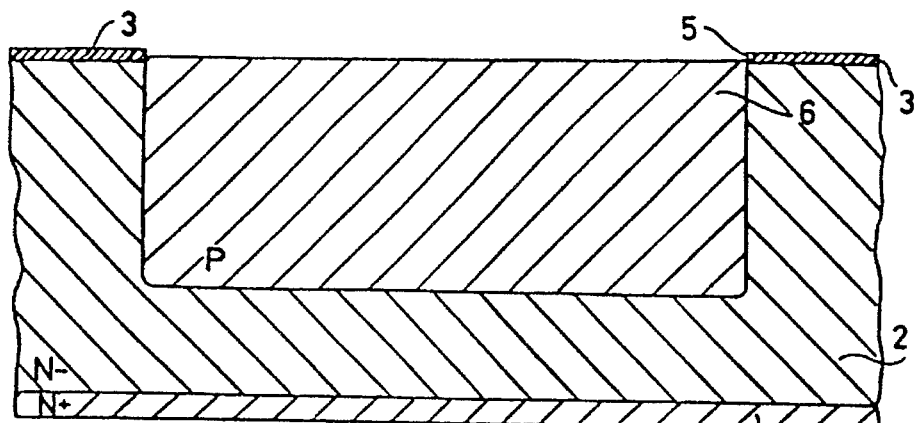
_Fig.1_
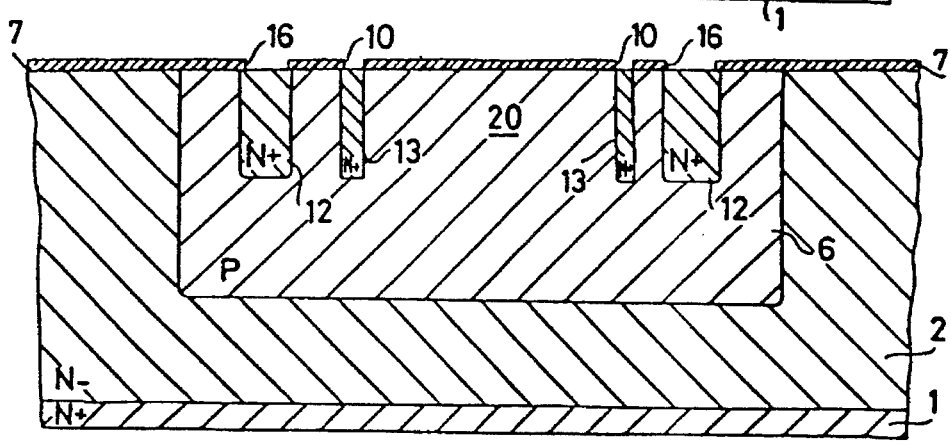
_Fig.2_
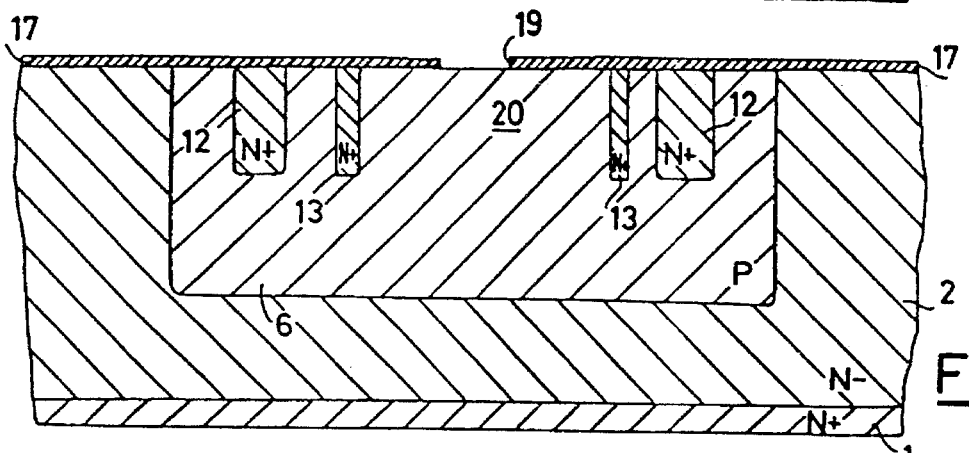
_Fig.3_
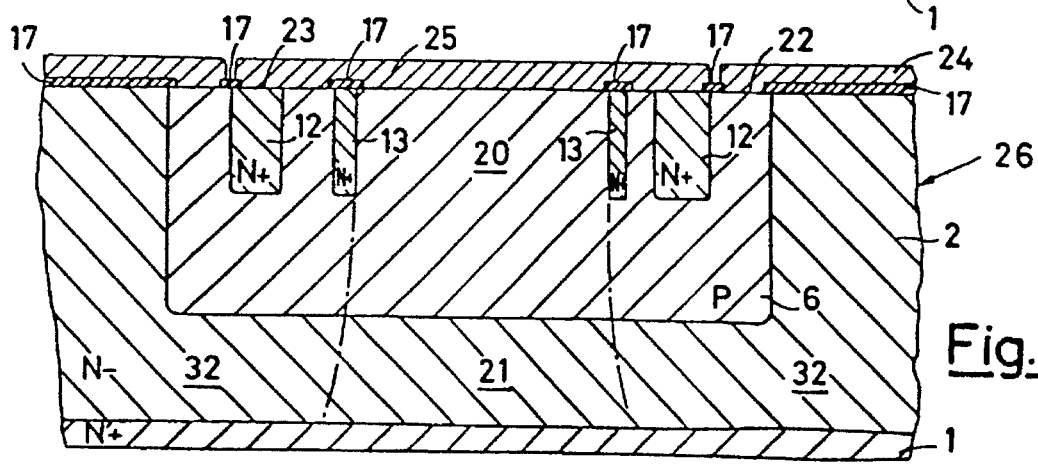
_Fig.4_

1

PROCESS FOR MANUFACTURING AN INTEGRATED BIPOLAR POWER DEVICE AND A FAST DIODE

This is a Division of application Ser. No. 07/852,310, filed Mar. 18, 1992, now U.S. Pat. No. 5,343,068.

BACKGROUND OF THE INVENTION

1. Field of the Invention

The present invention relates to an integrated circuit structure for a bipolar power device having high current density and a fast diode, and further relates to a manufacturing process for such device.

2. Description of the Prior Art

In bipolar devices, the lifetime of minority carriers strongly influences both the static characteristics and the dynamic characteristics of the device. The affected static characteristics include current capacity, and dynamic characteristics include switching times and energy loss per cycle. As far as static characteristics are concerned, it is known that the current capacity for bipolar transistors is determined by the profiles of the base and emitter regions, known as emitter efficiency. The current capacity is further determined by the thickness of the collector and by the lifetime of minority carriers in the active base region.

For example, for high voltage devices (400 volts or higher), the necessary large collector thickness requires the presence of minority carriers having very long lifetimes. This prevents the minority carriers from recombining along the active base region.

For the same purpose appropriate gettering techniques are used during device fabrication for absorbing metallic impurities. This results in a device having high minority carrier life times at the end of the high temperature thermal processes required during device fabrication. These techniques are basic to the manufacture of high voltage power transistors.

Relating to dynamic transistor characteristics, it is known that the planar technology used to manufacture bipolar power devices allows the integration of a diode between the collector and emitter. This may be done without any change to the manufacturing process flow. Such a diode, typically manufactured under the emitter contact area (emitter metalization) has a breakdown voltage equal to the power transistor's emitter-collector breakdown voltage. It also has very high reverse recovery times, typically ranging from 500 to 1000 nanoseconds due to the high minority carrier lifetimes. This causes large losses during transistor switching and limits its use in high frequency applications above a few tens or hundreds of KHz. In some power applications, such as motor controllers, for example, it is necessary to use diodes having lower reverse recovery times, typically in the 100 to 200 nanosecond range. These fast diodes can be obtained only with low minority carrier lifetimes, typically ranging from 0.5 to 1 microsecond. Naturally, such short lifetimes are incompatible with the high lifetimes necessary for high current capacity of the power transistor.

Thus, the current state of the art does not allow for the integration of fast diodes and bipolar power structures without strongly adversely impacting the transistor's static output characteristics. Currently, for applications requiring collector-to-emitter diodes, external diodes are used.

SUMMARY OF THE INVENTION

It is therefore an object of the present invention to allow the manufacture of a single integrated circuit structure including a bipolar power device and a fast diode. It is a further object of the present invention to provide such a device in which the bipolar device is characterized by high current densities during conduction and low switching losses during switching on. It is yet another object to provide such a device which is useful in particular applications such as motor controllers.

Therefore, according to the present invention, a bipolar power device and a fast diode are formed in a single chip of semiconductor material. The chip contains a first area having high minority carrier lifetimes in which the bipolar power device is formed. The bipolar power device is therefore capable of handling high current densities. At least one second area of the device is formed with reduced minority carrier lifetimes, with a fast diode being formed in this region.

BRIEF DESCRIPTION OF THE DRAWINGS

The features of the present invention shall be made more evident by the following detailed description of its embodiments, illustrating as a non limiting example in the enclosed drawing wherein:

FIGS. 1–4 illustrate successive process steps for the manufacture of an integrated structure according to the invention;

DETAILED DESCRIPTION OF THE INVENTION

Figure 5:
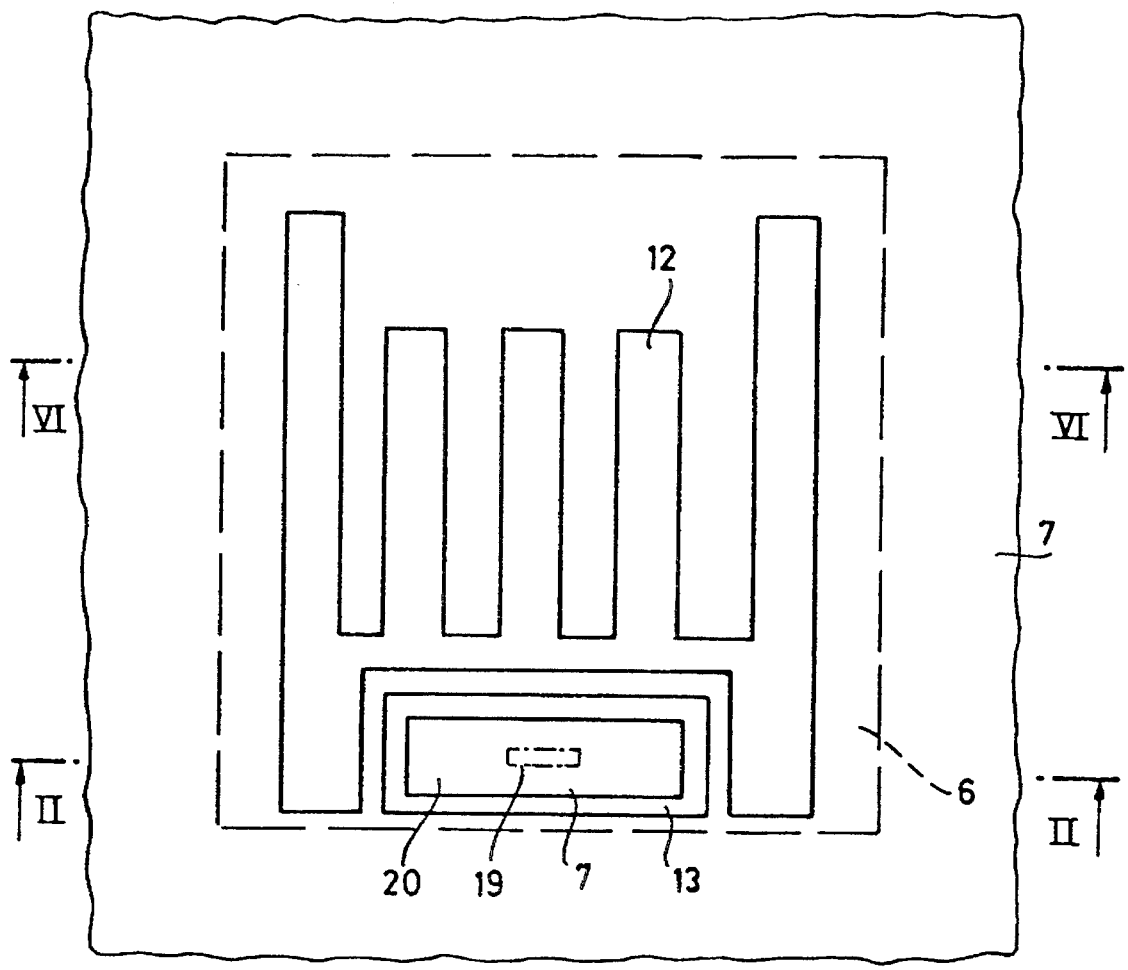
FIG. 5 is a top plane view of the structure of FIG. 2, the latter being a cross-sectional view taking along the line II—II of FIG. 5.

In summary, an integrated structure according to the present invention includes a substrate of semiconductor material doped a first conductivity type. An epitaxial layer is formed over the substrate, and a base region with a dopant of a second conductivity type is formed inside the epitaxial layer. An emitter region doped with the first conductivity type is formed inside the base region to form a bipolar power device. The entire structure contains impurities suitable for raising the lifetime of the minority carriers.

Within the base region there is at lease one annular region containing dopant of the first conductivity type. This annular region is suitable for circumscribing an underlying portion of the base region which is doped with ions suitable for reducing the lifetime of the minority carriers. This underlying region extends in depth through the epitaxial layer and down to the substrate to form the fast collector-emitter diode.

In a method according to the invention for manufacture of the described structure, a lightly doped epitaxial layer is grown on a substrate which is doped with the first conductivity type. An oxide mask is used to define an area for the base region, followed by implantation and diffusion of a dopant of the second conductivity type in the base region. A further oxide masking layer is formed to define an emitter region and at least one annular region. This annular region is suitable for circumscribing an under-region of the base region. Implantation and diffusion of a dopant of the first conductivity type is performed in the emitter region and in the annular region. A gettering process is carried out to increase minority carrier lifetimes. An implantation is then performed only in the under-region within the annular region of ions suitable for reducing the lifetime of minority carriers, followed by diffusion through the epitaxial layer down to the substrate.

With reference to the drawings, the above described method and structure are described in more detail. With reference now to FIG. 1, a silicon chip is provided constituting a substrate 1 which is doped N+. Over the substrate 1 there is grown an epitaxial layer 2 which is doped N– with a low concentration of dopant. This epitaxial layer 2 is necessary in power devices to provide a higher breakdown voltage, for example in the range of 100–1000 volts. Typically the resistivity of epitaxial layer 2 varies from 5–100 ohm*cm, and the thickness typically is between 5 and 100 micrometers.

On epitaxial layer 2 there is formed a layer of oxide 3, which after appropriate masking is subsequently etched so as to define a window 5 providing access to the epitaxial layer 2. An implantation of p-type ions, for example boron, is then made through the window 5. These ions are subsequently diffused at high temperature to form a base region 6 of and NPN bipolar power transistor, with the substrate 1 serving as the collector for this device.

Figure 6:
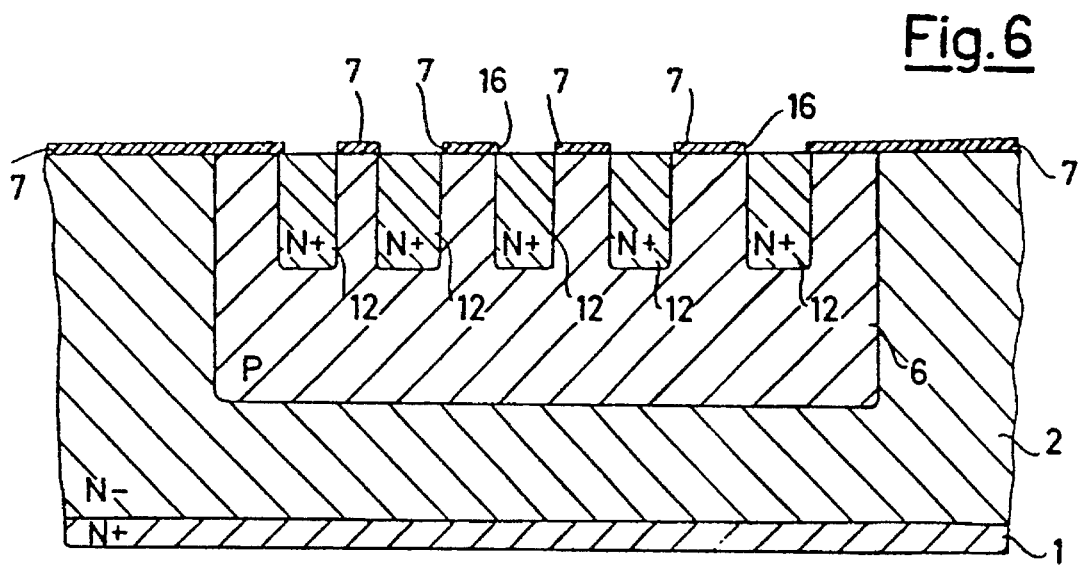
FIG. 6 is a cross-sectional view taken along the line VI—VI of FIG. 5.

With reference now to FIG. 2, an oxide layer 7 is subsequently formed on the surface of the device. The oxide layer 7 is masked and etched in such a way as to define a comb-like window 16, which may be more clearly see in FIGS. 5 and 6 and gives access to the base region 6, and an annular window 10 above the base region 6 but outside the window 16 (See FIG. 5). N+ type ions, arsenic for example, are then implanted through the windows 10 and 16. Subsequent diffusion forms an emitter region 12 for the bipolar NPN transistor, and an annular region 13. The comb-like surface extension of the emitter region 12 allows optimization of current distribution within the device.

Inside the annular region 13 there is defined an under-region 20 of the base region 6. Under-region 20 preferably has an area ranging from 200×200 micrometers$^2$ and 1000×1000 micrometers$^2$, and is suitable for constituting the anode region of a fast PN diode to be integrated with the bipolar device.

When the high temperature thermal processes have been completed, a process of absorption of impurities is then performed in the entire structure as known in the art. This has the purpose of increasing the lifetime of the minority carriers, thereby increasing the current capacity of the power device.

At this point, as shown in FIG. 3, the surface of the integrated structure is coated with a layer of oxide 17 which, after appropriate masking, is subsequently etched so as to define a window 19 giving access to the under-region 20. The window 19 typically has dimensions ranging from 50×50 micrometers$^2$ to 300×300 micrometers$^2$, and is located in the center of the diode area surrounded by the annular region 13. (See FIG. 5) An implantation is then made through the window 19 into the under-region 20. This implantation may be of gold ions, or in the alternative platinum ions, in an amount between approximately $10^{12}$ and $10^{15}$ atoms/cm$^2$. These ions are subsequently diffused at a low temperature (preferably ranging from 750° to 900° C.)

in the under-region 20 and into an underlying region 21 of the epitaxial layer 2. The ions diffuse down to the substrate 1, which constitutes the cathode region of the fast diode.

It is known that gold and platinum diffuse in silicon through the migration of interstitial atoms that can pass in a substitutional position of the silicon atoms according to known mechanisms. The implantation of gold or platinum in silicon may be accomplished by, for example, using an appropriate device for the ionization of metals having a high melting point. This may be used on ionic implanters of the type using ion sources of the Freeman type or similar devices, and is described in the European patent application No. 0439220 published on Jul. 31, 1991 in the name of CONSORZIO PER LA RICERCA SULLA MICROELETTRONICA NEL MEZZOGIORNO and through a process such as the one described in the U.S. patent application No. 07/794,390 filed on Nov. 19, 1991 in the name of CONSORZIO PER LA RICERCA SULLA MICROELETTRONICA NEL MEZZOGIORNO.

The dose and temperature of the implantation of gold in the silicon are selected so as to ensure that the gold ions diffuse vertically until they reach the substrate 1, but are wholly contained laterally within the underlying regions 20 and 21 inside the annular region 13. In particular, the dose of ions implanted and the temperature are obtained taking into account the values of characteristic parameters such as the coefficients of vertical and horizontal diffusion and the coefficient of segregation of gold in silicon.

Figure 7:
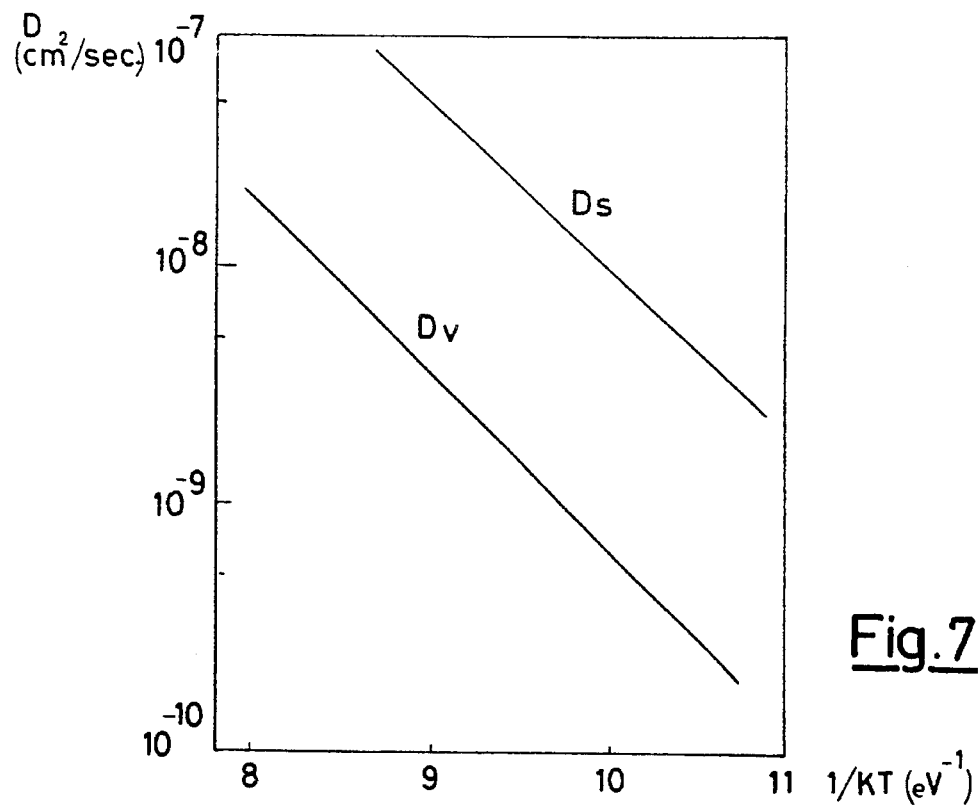
FIGS. 7 and 8 illustrate curves representing the coefficients of vertical and surface diffusion of gold ions in silicon and of the coefficient of segregation of gold and silicon as a function of temperature.

With reference to FIG. 7, the curves illustrate the coefficient of vertical diffusion Dv and the coefficient of surface diffusion Ds of gold at different temperatures. As an example, the coefficient of vertical diffusion of gold in silicon at 970° C. is about Dv=$10^{-9}$ cm$^2$/sec, while the coefficient of lateral diffusion at the surface of the silicon, due to the different conditions at the border, is appreciably higher. Typical values are Ds=$10^{-8}$ cm$^2$/sec at the same temperature of 970° C. In addition, the quantity of gold or platinum introduced into the silicon is distributed in relation to the concentration of dopant in the silicon.

Figure 8:
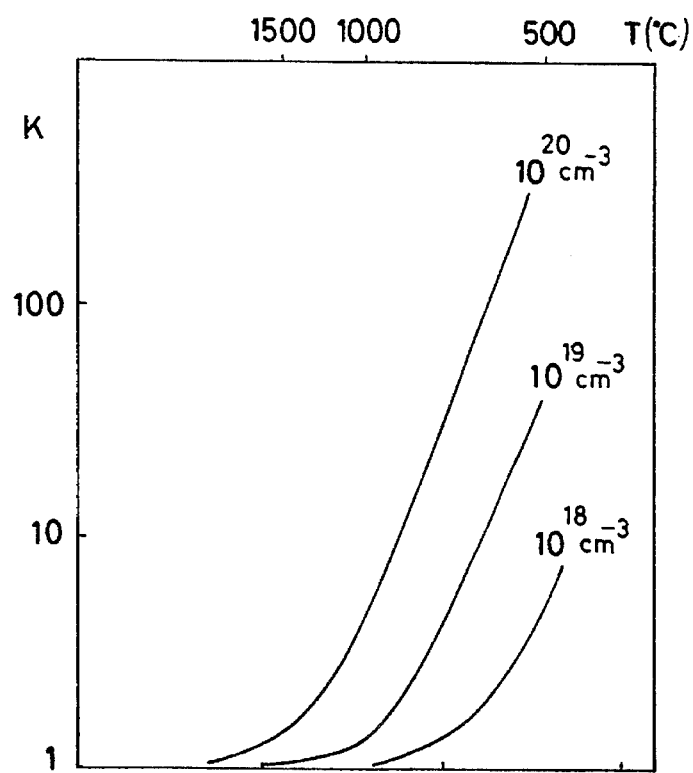

With reference to FIG. 8, it is seen that the curve of the coefficient of segregation K of gold and silicon, defined as the ratio between the concentration of gold in the more highly doped silicon and the concentration of gold in the less highly doped silicon, is strongly influenced by the temperature of diffusion and the concentration of silicon.

For equal concentrations of dopant in the silicon the coefficient of segregation rises with the fall of temperature. At a constant temperature the coefficient of segregation rises with the increase of the concentration of the dopant itself.

Therefore, it follows that, if a low temperature of diffusion of the gold and silicon is used, as soon as the gold atoms reach the internal wall of the annular region 13 they are stopped at the surface. This is due to the latter's high coefficient of segregation. The connection between the depth of diffusion represented by the thickness of the epitaxial layer 2 (typically between 20 and 100 micrometers) and the horizontal distance of diffusion constituted by the larger side of the under-region 20 defined inside the annular region 13 (typically between 200 and 1000 micrometers) depends on the dimension of the window 19 and on the ratio between the vertical and horizontal coefficients of diffusion.

Referring now to FIG. 4, after implantation and subsequent diffusion of gold or platinum in the underlying regions 20 and 21, the oxide 17 is partially removed. Oxide regions remain positioned on the surface of the integrated structure at the annular region 13 and on the sides of areas in which the contacts of the base 22 and emitter 23 are fabricated. Base and emitter metallizations, shown as 24 and 25 respectively, are then deposited. Since the annular region 13 remains covered by oxide region 17, the annular region 13 is not contacted by the metallization 25. Metallization 25 does contact the base under-region 20, forming a fast integrated diode between the emitter 12 and the collector 1.

As shown in FIG. 4, two distinct areas have now been manufactured inside a single device 26. One area is reserved for the fast diode, and includes the under-regions 20 and 21 circumscribed by the dashed lines. Gold or platinum has been diffused into these regions. The fast diode is therefore characterized by a short lifetime for the minority carriers, typically on the order of one microsecond or less. The remainder of the semiconductor chip, indicated generally as regions 32, has been used for the manufacture of an NPN bipolar power transistor. These regions contain high lifetimes for the minority carriers, typically ten microseconds or more, with the precise value being determined by the gettering process which is used.

The process described above for the manufacture of the structure shown in FIG. 4 can also be used to manufacture a structure which includes a transistor and a diode having several separate areas. The transistor is fabricated to have a high minority carrier lifetime (equal to 10 microseconds or more) and the diode areas having a low minority carrier lifetime (equal to approximately one microsecond or less).

In such an alternative embodiment, the methods illustrated in FIG. 1 are also used. Thus, an epitaxial layer 2 is grown on a substrate 1. The substrate is doped N+, while the epitaxial layer is more lightly doped N−. An oxide layer 3 is formed over the device, and a window 5 is formed through which boron is implanted, followed by a subsequent diffusion step at high temperature. This forms a P-type base region 6. After this point, the following process steps are illustrated in FIGS. 9, 10, and 11.

Figure 9:
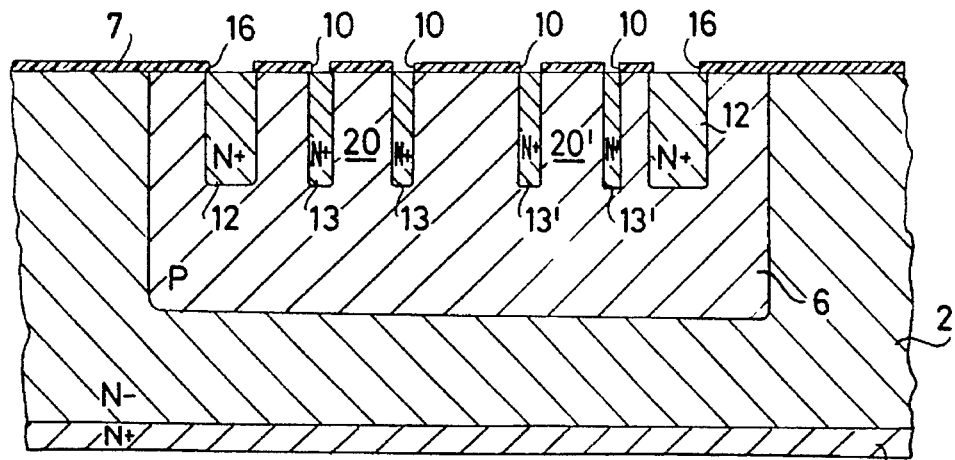
FIGS. 9–11 illustrate process steps that are alternative to those illustrated in FIGS. 1–4 for another embodiment of the integrated structure according to present invention.

Referring to FIG. 9, several annular regions are created between the emitter regions 12 instead of the single region described in connection with FIG. 2. These regions, 13, 13', are suitable for defining several under-regions 20, 20' of the base region 6.

Figure 10:
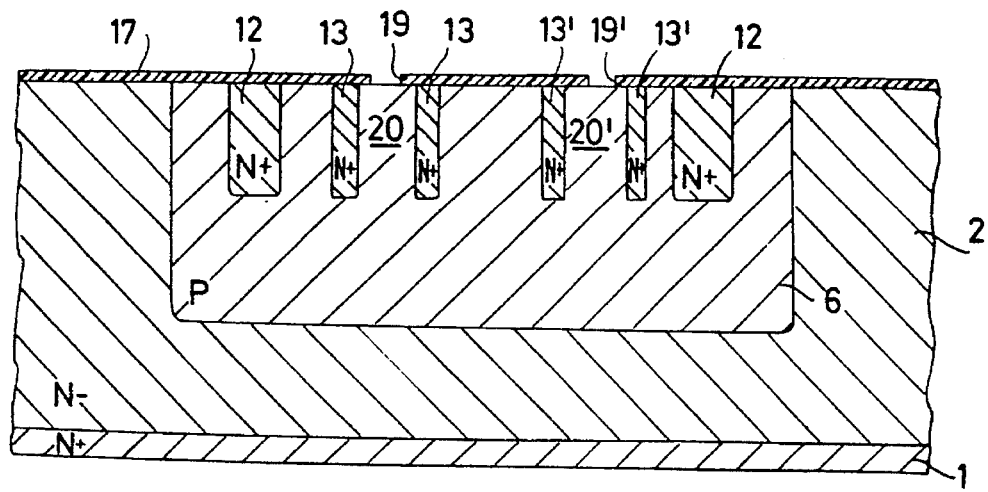

Referring to FIG. 10, several windows 19, 19' are then formed through an oxide layer, each located within a corresponding annular region 13, 13'. The dimensions of the windows 19, 19' are calculated as described above in relation to the larger dimension of each annular region 13, 13', and in relation to the thickness of the epitaxial layer 2 and to the implantation dose and diffusion temperature of the gold or platinum which is used.

Figure 11:
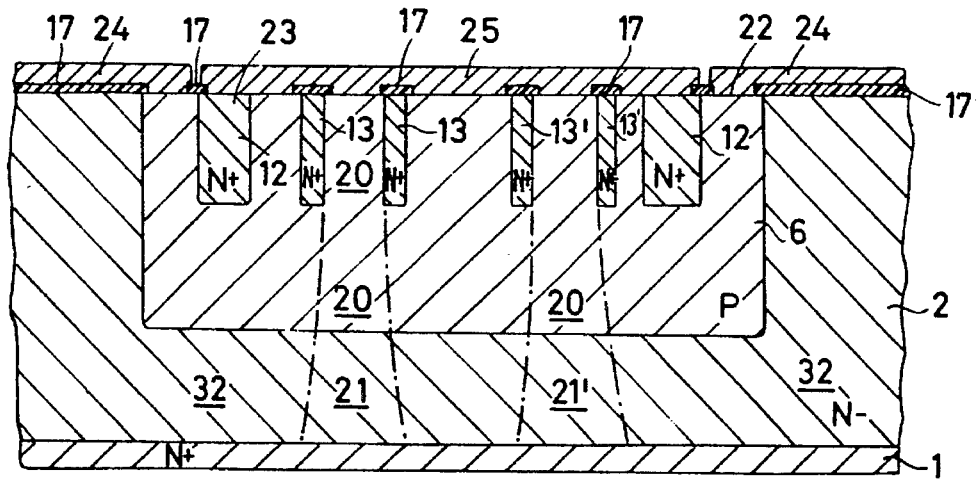

Referring to FIG. 11, diffusion of the gold or platinum impurities forms regions 20, 20', and 21, 21' extending to the substrate 1. Lastly, base 22 and emitter 23 contacts are formed, followed by base 24 and emitter 25 metallizations.

There has thus been obtained a bipolar power device having a high minority carrier lifetime. Together with this bipolar device, there has been integrated a diode between the collector and emitter which has a low minority carrier lifetime. This diode may be formed from a single area or multiple areas. This diode allows better control of the current recovery features of the device during switching.

We claim:

1. A process for the manufacture of an integrated structure containing a bipolar power device with high current density and a fast diode, comprising the steps of: growing an epitaxial layer on a substrate semiconductor material with dopant of a first type, forming an oxide layer over said epitaxial layer, masking and etching the oxide layer to define a base region, implanting and diffusing dopant of a second type into said base region, forming a second oxide layer over said epitaxial layer, masking and etching said second oxide layer to define an emitter region and at least one annular region which laterally delimits a portion of said base region, implanting and diffusing dopant of the first type into said emitter region and into said at least one annular region, introducing impurities into the entire structure to increase the lifetime of minority carriers, implanting inside said portion of the base region ions suitable for reducing the lifetime of the minority carriers, and diffusing them in depth into an underlying portion of the epitaxial layer and down to the substrate.

2. The process according to claim 1 wherein the implantation of said at least one annular region is accomplished so as to determine a high coefficient segregation with respect to said ions.

3. The process according to claim 1, wherein said ions are ions of gold.

4. The process according to claim 1, wherein said ions are ions of platinum.

* * * * *